US007514185B2

(12) United States Patent
Fukushima et al.

(10) Patent No.: US 7,514,185 B2
(45) Date of Patent: Apr. 7, 2009

(54) PREPARATION OF PHOTOMASK BLANK AND PHOTOMASK

(75) Inventors: Noriyasu Fukushima, Joetsu (JP); Hiroki Yoshikawa, Joetsu (JP); Hideo Kaneko, Joetsu (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 764 days.

(21) Appl. No.: 11/130,278

(22) Filed: May 17, 2005

(65) Prior Publication Data

US 2005/0260505 A1 Nov. 24, 2005

(30) Foreign Application Priority Data

May 18, 2004 (JP) ............................ 2004-147403

(51) Int. Cl.
*G03F 1/00* (2006.01)
(52) U.S. Cl. ........................................... 430/5

(58) Field of Classification Search .................. 430/5, 430/394; 204/192.2; 378/35
See application file for complete search history.

(56) References Cited

U.S. PATENT DOCUMENTS 6,905,801 B2 * 6/2005 Liang et al. ................... 430/5
7,195,846 B2 * 3/2007 Kaneko et al. ................. 430/5
2004/0110073 A1 6/2004 Kaneko et al.

FOREIGN PATENT DOCUMENTS

JP 07-140635 A 6/1995

* cited by examiner

*Primary Examiner*—Stephen Rosasco
(74) *Attorney, Agent, or Firm*—Birch, Stewart, Kolasch & Birch, LLP

(57) ABSTRACT

A photomask blank is prepared by forming a light-absorbing film on a transparent substrate, and irradiating the light-absorbing film with light from a flash lamp at an energy density of 3 to 40 J/cm$^2$. A photomask is prepared by forming a resist pattern on the photomask blank by photolithography, etching away those portions of the light-absorbing film which are not covered with the resist pattern, and removing the resist.

17 Claims, 1 Drawing Sheet

PREPARATION OF PHOTOMASK BLANK AND PHOTOMASK

CROSS-REFERENCE TO RELATED APPLICATION

This non-provisional application claims priority under 35 U.S.C. §119(a) on Patent Application No. 2004-147403 filed in Japan on May 18, 2004, the entire contents of which are hereby incorporated by reference.

TECHNICAL FIELD

This invention relates to a method for preparing a photomask blank and a photomask for use in the microprocessing of semiconductor integrated circuits, color filters for charge-coupled device (CCD) and liquid crystal display (LCD), magnetic heads and the like.

BACKGROUND ART

While lithography is utilized in the fabrication of semiconductor integrated circuits having an ever increasing degree of integration, the exposure system is in advancement toward a shorter wavelength. Progressive shifts have been made from the ultraviolet radiation including g-line (436 nm) and i-line (365 nm) to deep ultraviolet radiation, typically KrF excimer laser (248 nm) and ArF excimer laser (193 nm) and even to $F_2$ laser (157 nm).

The reduction of exposure wavelength improves the resolution, but reduces the depth of focus (DOF), which leads to a narrower process margin and lower stability, imposing detrimental impact on the manufacturing yield of products.

One approach for overcoming the problem is a phase shift method. Inter alia, the use of halftone phase shift masks improves DOF. Since an increase of DOF enlarges the process margin, this is indispensable for the future microprocessing technology. The future lithography candidates proposed by the International Technology Roadmap for Semiconductors (ITRS) include a phase shift mask (PSM) adapted to exposure to ArF excimer laser as a candidate for the technology node 90 nm.

The phase shift mask has a phase shifter film through which exposure light is phase shifted 180 degrees. The light transmitted by the phase shifter film pattern and the light transmitted by the portion where the phase shifter film is absent have reverse phases. These lights of reverse phases overlap at the interface therebetween so that the light intensity becomes zero, yielding a light intensity distribution where an acute change appears at the interface. This results in an increased DOF and an improved image contrast.

The phase shift masks include Levenson, halftone and other types. Of the halftone phase shift masks proposed thus far, single layer halftone phase shift masks have a simple structure. The single layer halftone phase shift masks proposed thus far have phase shifter films made of amorphous silicon, silicon nitride, molybdenum silicide oxide (MoSiO) or molybdenum silicide oxynitride (MoSiON) as described in JP-A 7-140635.

In preparing these phase shift masks, a method of patterning a phase shift mask blank by lithography is typically employed. The lithography process involves applying a resist onto a phase shift mask blank, irradiating selected portions of the resist coating with electron beams or ultraviolet radiation, developing the resist coating until the phase shifter film surface is exposed in the irradiated portions, etching the phase shifter film through the patterned resist coating as a mask until the substrate is exposed, thereafter stripping the resist coating. A phase shift mask is obtained in this way.

In most photomask blanks as typified by phase shift mask blanks, a film such as phase shifter film is generally deposited on a substrate by sputtering. Stress is introduced into the film by which the underlying substrate is more or less distorted. The resulting photomask blank thus suffers warp due to the film stress. When a photomask is prepared by pattering such a warped photomask blank whereby the film is partially removed as a result of patterning, the film stress applied to the substrate is partially released so that the substrate is recovered from the warped state near to the state prior to the deposition. As a result, the substrate changes its flatness. This change introduces a positional shift between the stage of pattern exposure and the actually finished mask, which provides a greater influence as the mask pattern becomes finer. It also causes a focusing offset when pattern exposure is carried out using the photomask.

SUMMARY OF THE INVENTION

An object of the present invention is to provide a method for preparing a photomask blank having a light-absorbing film formed on a substrate in which the stress in the light-absorbing film is controlled optimum. Another object is to provide a method for preparing a photomask from the photomask blank.

The inventor has discovered that in the preparation of a photomask blank having a light-absorbing film formed on a transparent substrate, the light-absorbing film after its formation is irradiated with light from a flash lamp at a predetermined energy density, whereby the film stress of the photomask blank can be controlled. By irradiating the light-absorbing film with light from a flash lamp, the stress in the light-absorbing film is optimized so as to minimize the warp of the photomask blank. Thus, a photomask resulting from this photomask blank enables pattern exposure at a finer feature size and at a higher precision.

More specifically, in the method of making a photomask blank having a light-absorbing film on a transparent substrate, once a light-absorbing film is formed on a transparent substrate, the light-absorbing film having a certain stress produced therein is irradiated with light from a flash lamp (1) at an energy density of 3 to 40 J/cm$^2$; or (2) at such an energy density that the stress in the light-absorbing film becomes −300 to 300 MPa in compression stress as a result of light exposure; or (3) at an energy density in a range of ±5 J/cm$^2$ relative to the central value equal to the energy density at which the stress in the light-absorbing film is 0 MPa as a result of light exposure. The controlled flashing light irradiation enables to reduce the film stress to nearly zero (a warpage of not more than about 0.1 μm). In addition, the stress in the light-absorbing film is controlled while taking into account the partial release of the film stress by patterning during the preparation of a photomask from the photomask blank. The thus obtained photomask is endowed with optimum flatness.

In one embodiment, the present invention provides a method for preparing a photomask blank having a light-absorbing film on a transparent substrate, comprising the steps of forming a light-absorbing film on a transparent substrate, and irradiating the light-absorbing film with light from a flash lamp at an energy density of 3 to 40 J/cm$^2$.

In another embodiment, the invention provides a method for preparing a photomask blank having a light-absorbing film on a transparent substrate, comprising the steps of forming a light-absorbing film on a transparent substrate, and irradiating the light-absorbing film with light from a flash lamp at such an energy density that the stress in the light-absorbing film becomes −300 to 300 MPa in compression stress as a result of light exposure.

In still another embodiment, the invention provides a method for preparing a photomask blank having a light-absorbing film on a transparent substrate, comprising the steps of forming a light-absorbing film on a transparent substrate, and irradiating the light-absorbing film with light from a flash lamp at an energy density in a range of ±5 J/cm$^2$ relative to the central value equal to the energy density at which the stress in the light-absorbing film is 0 MPa as a result of light exposure.

In all the embodiments, the light-absorbing film is typically formed by sputtering. Preferably, the light-absorbing film is a halftone phase shift film comprising at least one layer comprising silicon, a metal other than silicon, and at least one element selected from oxygen, nitrogen and carbon. The metal other than silicon is typically selected from the group consisting of W, Mo, Ti, Ta, Zr, Hf, Nb, V, Co, Cr and Ni and mixtures thereof.

In a preferred embodiment, the halftone phase shift film has a transmittance of 5 to 7% to KrF excimer laser light, and is irradiated with light from the flash lamp at an energy density of 5.5 to 16.5 J/cm$^2$; or the halftone phase shift film has a transmittance of 18 to 32% to KrF excimer laser light, and is irradiated with light from the flash lamp at an energy density of 16.8 to 31 J/cm$^2$.

In a preferred embodiment, the halftone phase shift film has a transmittance of 5 to 7% to ArF excimer laser light, and is irradiated with light from the flash lamp at an energy density of 14.7 to 27.5 J/cm$^2$; or the halftone phase shift film has a transmittance of 18 to 32% to ArF excimer laser light, and is irradiated with light from the flash lamp at an energy density of 21 to 36 J/cm$^2$.

In a preferred embodiment, the halftone phase shift film has a transmittance of 5 to 7% to F$_2$ laser light, and is irradiated with light from the flash lamp at an energy density of 21.8 to 36 J/cm$^2$; or the halftone phase shift film has a transmittance of 18 to 32% to F$_2$ laser light, and is irradiated with light from the flash lamp at an energy density of 25.2 to 40 J/cm$^2$.

Preferably, the flash lamp produces flashes of light having a duration of 0.1 to 100 msec. Preferably, the irradiating step continues to a cumulative irradiation time of up to 1 second. Also in the irradiating step, the substrate is preferably heated at 50 to 300° C. Advantageously, the irradiating step is carried out in a nitrogen atmosphere.

In another aspect, the present invention provides a method for preparing a photomask, comprising the steps of forming a resist pattern on the photomask blank resulting from the aforementioned method by photolithography, etching away those portions of the light-absorbing film which are not covered with the resist pattern, and removing the resist.

The present invention ensures the preparation of a photomask blank and a photomask, both having a warpage controlled to a predetermined or optimum range. At the same time, the invention is successful in improving the chemical resistance of the photomask blank and photomask, and especially in suppressing any change in phase shift of the phase shifter film by alkali treatment.

DESCRIPTION OF THE PREFERRED EMBODIMENTS

Figure 1:
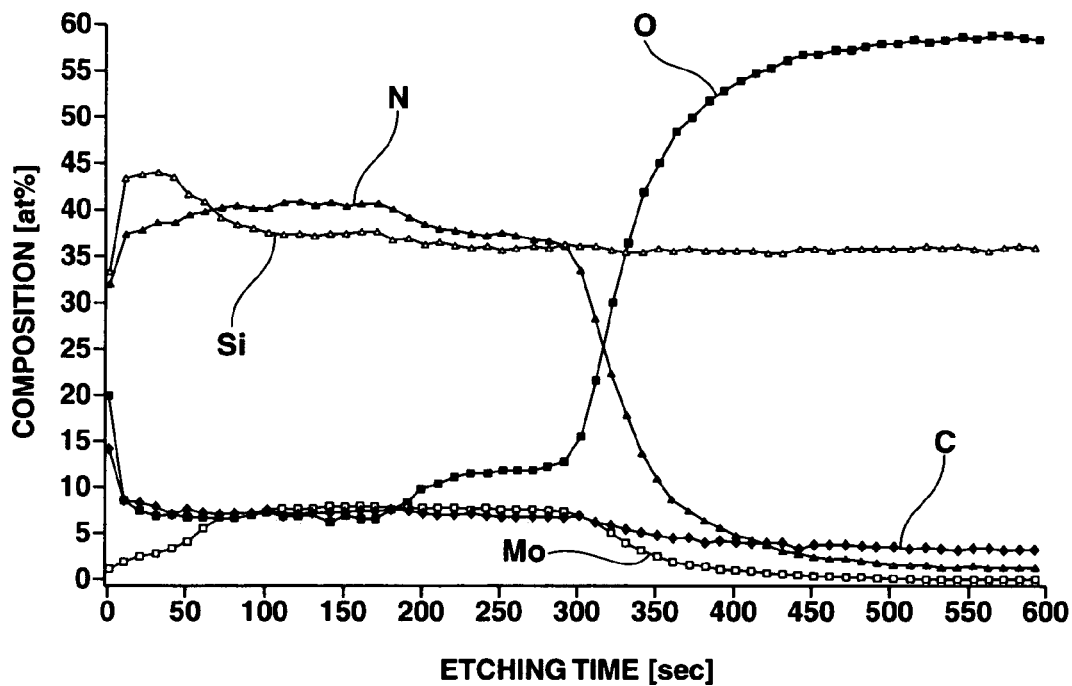
FIG. 1 is an XPS profile showing the results of compositional analysis in thickness direction of a halftone phase shift film prior to flash light irradiation in Example 4.

The present invention pertains to a method for preparing a photomask blank by forming on a transparent substrate a light-absorbing film with a certain stress produced therein.

A first embodiment of the invention is a method for preparing a photomask blank comprising the steps of forming a light-absorbing film on a transparent substrate, and irradiating the light-absorbing film with light from a flash lamp at an energy density of 3 J/cm$^2$ to 40 J/cm$^2$.

A second embodiment of the invention is a method for preparing a photomask blank comprising the steps of forming a light-absorbing film on a transparent substrate, and irradiating the light-absorbing film with light from a flash lamp at such an energy density that the stress in the light-absorbing film becomes −300 MPa to 300 MPa in compression stress as a result of light exposure.

A third embodiment of the invention is a method for preparing a photomask blank comprising the steps of forming a light-absorbing film on a transparent substrate, and irradiating the light-absorbing film with light from a flash lamp at an energy density in a range of ±5 J/cm$^2$ relative to the central value equal to the energy density at which the stress in the light-absorbing film is 0 MPa as a result of light exposure.

In all the embodiments, various properties of the light-absorbing film are improved by irradiating it with light from a flash lamp. It is believed that film properties are improved by reason that the atom bond state, defect quantity, surface composition (e.g., degree of oxidation or nitridation) and other factors of the film are altered by light absorption, an abrupt film temperature change or a combination thereof. By irradiating the light-absorbing film with flash lamp light, stress relaxation due to annealing occurs to such an extent that optimizes the warpage of the photomask blank and improves the chemical resistance of the film.

The flash lamp is a light source producing flashes of light of short duration and having a continuous wide wavelength region, for example, a discharge lamp comprising a tube of light-transmissive material such as glass and a fill gas such as xenon wherein a high voltage is applied in pulses to produce flashes of light. This brings out many advantages. Unlike the laser, the flash lamp eliminates a need for a film having a high light absorption (or a low transmittance) at a certain wavelength and imposes only a few limits on the effective film material. There is no need for scanning. In a single step, the overall surface can be irradiated with a sufficient quantity of energy to achieve a desired effect within a brief time. Due to the wide wavelength region, the effects of different wavelengths are simultaneously achieved.

Potential means for film quality improvement include hot plates, heaters, halogen lamps, infrared lamps, furnaces, rapid thermal processors (RTP) and the like. Some of them are not effective. If a more quantity of energy is supplied in order to achieve a better effect, the temperature of the substrate is also elevated so that the substrate may be damaged. Heating requires a time to compromise productivity. The flash lamp irradiation also referred to as "flash rapid thermal annealing" (FRTA) according to the invention is advantageous in film quality improvement.

In the event where the light-absorbing film is a multilayer structure film, the film stress can be improved while keeping unchanged the layer structure and the function of the respective layers. Even where a layer transparent to flash lamp light intervenes in the multilayer film, properties of the entire multilayer film are improved, with the same advantages available.

With respect to the irradiation power, if the intensity of irradiating light is too high, the film can be scattered or roughened. If the intensity of irradiating light is too low, the effect of improving film quality becomes less. It is thus necessary to irradiate light at an appropriate intensity.

The flash lamp produces flashes of light preferably having a duration of 0.1 to 100 msec. A duration of less than 0.1 msec has a possibility that a certain flash of light does not become extinct before the next. A flash of light may not continue for a duration of more than 100 msec.

The irradiation time should preferably be not too long. A relatively short irradiation time is preferred because only the film can be modified without a substantial heating of the substrate. The irradiating step preferably continues to a cumulative irradiation time of up to 1 sec, more preferably up to 0.1 sec, and most preferably up to 0.01 sec. The lower limit of cumulative irradiation time is typically 1.0 msec though not critical.

In a preferred embodiment, the film is irradiated with flash lamp light while the substrate is heated at 50 to 300° C. This offsets the difference between lots in the rising of the substrate temperature by consecutive irradiation of flash lamp light, and reduces the variation in phase shift among substrates without substantially altering the variation in transmittance among substrates.

In the invention, the substrate is preferably a transparent substrate made of synthetic quartz glass, calcium fluoride or the like. The film formed thereon should preferably have a lower light transmittance than the substrate because a more effect of flash lamp light is exerted on the film than on the substrate.

The light-absorbing films used herein include a phase shift film, a light-shielding film, an antireflective film and other films which are formed on the photomask blank. The methods of the invention are advantageously applicable to phase shift mask blanks having phase shift films, especially halftone phase shift films, formed on substrates.

The halftone phase shift films are generally divided in terms of transmittance into low transmissive films having a low transmittance of about 6% and high transmissive films having a high transmittance of about 18 to 32%; and in terms of wavelength of exposure light into KrF excimer laser, ArF excimer laser and $F_2$ laser uses. For the same film, the transmittance at the wavelength increases in the order of $F_2$ laser, ArF excimer laser and KrF excimer laser.

Since the absorption efficiency of exposure light varies with its wavelength, it is preferred that the energy density of irradiating flash lamp light be adjusted adequate to optimize the film stress. Thus, for each of halftone phase shift mask blanks having low transmittance type or high transmittance type halftone phase shift films utilizing the exposure light wavelength of KrF excimer laser, ArF excimer laser and $F_2$ laser, the irradiation energy density should preferably be set as follows.

(1) Flash lamp light is irradiated at an energy density of 5.5 to 16.5 J/cm$^2$ where the halftone phase shift film has a transmittance of 5 to 7% to KrF excimer laser light.
(2) Flash lamp light is irradiated at an energy density of 16.8 to 31 J/cm$^2$ where the halftone phase shift film has a transmittance of 18 to 32% to KrF excimer laser light.
(3) Flash lamp light is irradiated at an energy density of 14.7 to 27.5 J/cm$^2$ where the halftone phase shift film has a transmittance of 5 to 7% to ArF excimer laser light.
(4) Flash lamp light is irradiated at an energy density of 21 to 36 J/cm$^2$ where the halftone phase shift film has a transmittance of 18 to 32% to ArF excimer laser light.
(5) Flash lamp light is irradiated at an energy density of 21.8 to 36 J/cm$^2$ where the halftone phase shift film has a transmittance of 5 to 7% to $F_2$ laser light.
(6) Flash lamp light is irradiated at an energy density of 25.2 to 40 J/cm$^2$ where the halftone phase shift film has a transmittance of 18 to 32% to $F_2$ laser light.

The atmosphere where the film is irradiated with flash lamp light is not particularly limited. An inert gas such as argon, nitrogen, oxygen, a mixture containing at least one of nitrogen and oxygen, vacuum, air and the like are included although a nitrogen atmosphere is preferred. When irradiation is done in oxygen or nitrogen, the film can be oxidized or nitrided, or surface oxidation or nitridation occur. If oxidation or nitridation is desired, the film-bearing substrate is placed in an atmosphere containing oxygen and/or nitrogen; and if oxidation or nitridation should be avoided, the film-bearing substrate is placed in an inert gas atmosphere or in vacuum before it is irradiated with flash lamp light. Irradiation with flash lamp light can be carried out under a pressure in the range from a vacuum (e.g., approximately $5\times10^{-6}$ Pa) to atmospheric pressure.

In the practice of the invention, the film may be irradiated with flash lamp light in a single flash or in plural flashes. Where the film has a multilayer structure, flash light irradiation may be carried out whenever a layer is deposited, or overall irradiation be carried out after a plurality of layers have been deposited. Alternatively, flash light irradiation is carried out only when a certain layer for which stress relaxation is desired is deposited, and before and after that layer, layers are deposited without irradiation. Particularly in the preparation of a phase shift mask blank comprising in sequence, a substrate, a phase shift film of a single layer or a plurality of layers, a light-shielding film and/or an antireflective film such as metal films, typically Cr films, if the metal film (e.g., light-shielding film) can be scattered by irradiating light of a power sufficient to exert the effect of improving the phase shift film, the recommended procedure is by forming the phase shift film, irradiating it with flash lamp light, and thereafter, forming a metal film. The surface by which flash lamp light is transmitted may be the upper surface of the film or the lower surface of the substrate if light is transmitted by the substrate.

Any well-known methods may be used in depositing light-absorbing films such as a phase shift film, light-shielding film and antireflective film on a substrate. Since the invention is more effective for minimizing the warpage of a blank having films formed by sputtering and improving the chemical resistance of such films, the deposition of films by sputtering is of particular interest. With respect to the sputtering technique, a reactive sputtering technique is preferred when it is desired for the film to contain light elements such as oxygen, nitrogen and carbon. The desired film can be deposited by using a target of a preselected composition, and sputtering the target in a sputtering gas atmosphere containing necessary light elements.

The sputtering gas used for deposition may be a mixture of an inert gas such as argon and any gas containing at least one of oxygen, nitrogen, and carbon, such as oxygen, nitrogen, nitrogen oxides, or carbon oxides, which is added so that the film being deposited may have the desired composition.

The sputtering system may use a direct current (DC) power supply or a radio frequency (RF) power supply and be of the magnetron sputtering mode or the conventional mode. The deposition system may be either a continuous passage system or a single wafer processing system.

No particular limit is imposed on the film to be irradiated with flash lamp light as long as the film is deposited on a substrate to form a photomask blank. The films contemplated herein include a phase shift film, a light-shielding film, an antireflective film and other films, with the phase shift film being preferred. Most preference is given to a halftone phase shift film which has a greater absorptivity to exposure light than the substrate and should thus avoid any slight change of the film by chemical liquid treatment, because the effect of flash lamp light irradiation is greater. If the film is not fully absorptive to light, a supplementary light-absorbing layer may be formed before the flash lamp light irradiation.

The phase shift film is typically an amorphous silicon film or a metal compound film containing oxygen, nitrogen, carbon or the like. The preferred phase shift film is a halftone phase shift film comprising a single layer or multiple layers comprising silicon, a metal other than silicon, and at least one element selected from oxygen, nitrogen and carbon. The metal other than silicon is selected from the group consisting of W, Mo, Ti, Ta, Zr, Hf, Nb, V, Co, Cr and Ni and mixtures thereof. Films based on molybdenum are preferred because they derive more of the warpage-reducing and chemical resistance-improving effects. Suitable molybdenum based films include those of molybdenum silicide oxide (MoSiO), molybdenum silicide nitride (MoSiN), molybdenum silicide carbide (MoSiC), molybdenum silicide oxynitride (MoSiON), molybdenum silicide oxycarbide (MoSiOC) and molybdenum silicide oxide nitride carbide (MoSiONC). These phase shift films of molybdenum silicide compositions can be deposited by a reactive sputtering technique using a target of MoSi or the like.

The thickness of the phase shift film varies with a particular wavelength of exposure light on use of the phase shift mask, the transmittance and phase shift of the phase shift layer although it is generally in a range of 30 to 200 nm, preferably 50 to 130 nm.

It is possible to form a light-shielding film on the phase shift film and to further form an antireflective film on the light-shielding film for reducing reflection therefrom.

In this embodiment, the light-shielding film or antireflective film may be a chromium based film such as chromium or a chromium compound containing at least one element selected from oxygen, carbon and nitrogen as well as chromium, or a laminate of such films.

The chromium-based light-shielding film or chromium-based antireflective film may be deposited by using a target of neat chromium or a chromium compound containing oxygen, carbon or nitrogen or a combination thereof as well as chromium, using as the sputtering gas a mixture of an inert gas such as argon and at least one of oxygen, nitrogen, nitrogen oxides, carbon oxides and hydrocarbons (e.g., methane) which is added so that the film being deposited may have the desired composition, and effecting reactive sputtering.

A phase shift mask is prepared from the phase shift mask blank having a phase shift film formed on a substrate as described above, by further forming a resist coating on the blank, patterning the resist coating by lithography, etching the phase shift film through the patterned resist coating, and stripping the resist coating. The steps of resist application, patterning (light exposure and development), etching, and stripping may be carried out by any well-known methods.

EXAMPLE

Examples of the invention are given below by way of illustration and not by way of limitation.

Examples 1 to 5

A halftone phase shift film of MoSiON was deposited on a square quartz substrate of 6 inches on one side by reactive DC sputtering of a MoSi target such that at the end of flash lamp irradiation, the film might have a phase shift of 180° relative to exposure light (ArF excimer laser: 193 nm), a transmittance of 6% with respect to exposure light (provided that the bare substrate had a transmittance of 100% with respect to exposure light), and a thickness of about 700 angstroms.

The substrate having the halftone phase shift film deposited thereon was heated at a temperature of 80° C., and then irradiated with light from a xenon flash lamp at an energy density reported in Table 1. The flash lamp was operated to produce flashes of light having a duration of about 1 to 10 msec by controlling the voltage. The irradiation included a single flash of light (the same being true in the following examples). The stress in the film before and after the flash lamp irradiation was determined, with the results being shown in Table 1. The film stress was determined by measuring the warpage of the film by a flatness tester FT-900 (Nidek Co., Ltd.), and converting it into a stress (the same being true in the following examples).

TABLE 1

| | Energy density ($J/cm^2$) | Before irradiation | | After irradiation | |
|---|---|---|---|---|---|
| | | Stress direction | Stress (MPa) | Stress direction | Stress (MPa) |
| Example 1 | 16.7 | compressive | 1170 | compressive | 694 |
| Example 2 | 18.9 | compressive | 1258 | compressive | 618 |
| Example 3 | 22.1 | compressive | 1212 | tensile | 147 |
| Example 4 | 23.9 | compressive | 1257 | tensile | −184 |
| Example 5 | 27.2 | compressive | 1250 | tensile | −352 |

For the substrate having the halftone phase shift film deposited thereon in Example 4, the influence of the film stress after irradiation on the flatness of the substrate (that is, a change of warpage of the substrate when a photomask was prepared from the photomask blank) was ascertained, finding that the warpage change was fully below 0.1 μm, indicating full relaxation of the film stress.

Figure 2:
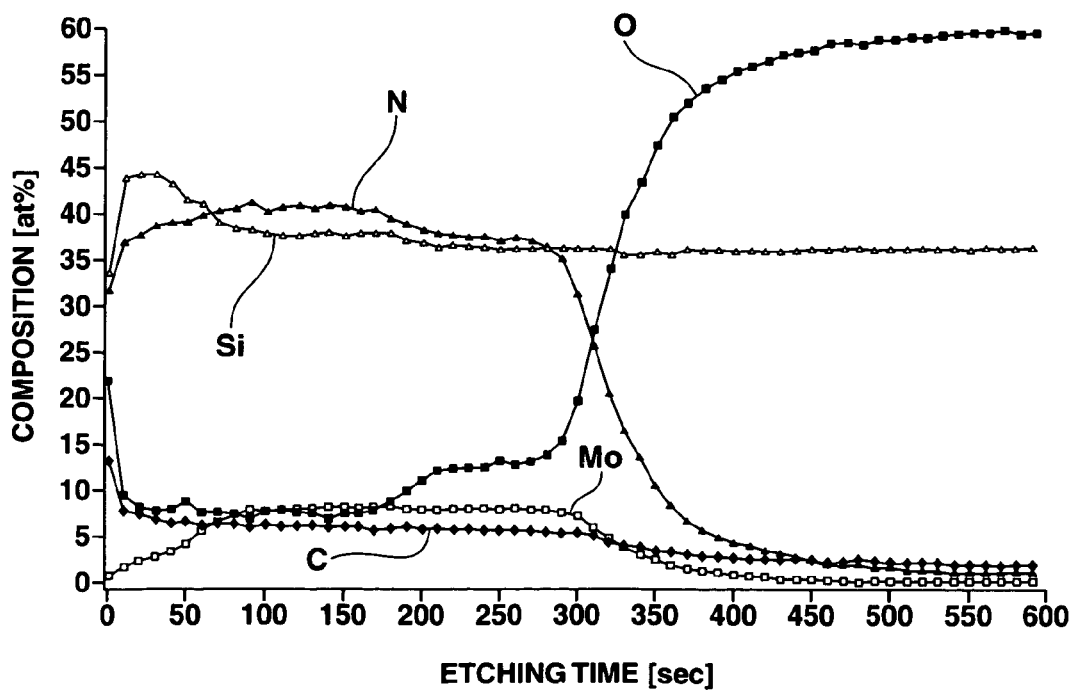
FIG. 2 is an XPS profile showing the results of compositional analysis in thickness direction of a halftone phase shift film after flash light irradiation in Example 4.

For the substrate having the halftone phase shift film deposited thereon in Example 4, the composition in thickness direction of the halftone phase shift film was analyzed by x-ray photoelectron spectroscopy (XPS) both before and after the flash lamp irradiation. FIGS. 1 and 2 diagrammatically illustrate the XPS profiles before and after the flash lamp irradiation, respectively. It is seen from these results that the film composition was kept unchanged before and after the flash lamp irradiation.

For the substrate having the halftone phase shift film deposited thereon in Example 4, the phase shift and transmittance distribution of the halftone phase shift film were measured both before and after the flash lamp irradiation, with the results shown in Table 2. Measurement was made within a square region delimited about the center of the halftone phase shift film-depositing surface of the substrate and along the peripheries thereof (i.e., a square region having four corners spaced 95 mm from the center of that surface) (the same applies to the subsequent measurements of phase shift and transmittance distribution).

TABLE 2

| | Phase shift (°) | Transmittance (%) |
|---|---|---|
| Before irradiation | 0.92 | 0.02 |
| After irradiation | 0.63 | 0.13 |

The data show that the irradiation with flash lamp light has no impact at a practically unacceptable level on the distribution of phase shift and transmittance within the substrate surface (or film surface).

It is thus seen that the irradiation with flash lamp light brings no damage at a practically unacceptable level to the film composition, phase shift and transmittance of the halftone phase shift film.

Further, a substrate having a halftone phase shift film deposited thereon as in Example 4 was subjected to chemical treatment. Table 3 shows changes of phase shift and transmittance before and after the chemical treatment.

The chemical treatment included two sequences of alternate SPM treatments and SC1 treatments.

SPM (Sulfuric Acid/Hydrogen Peroxide Mix) Treatment
  immersed in a 1:4 (volume ratio) mixture of sulfuric acid/hydrogen peroxide at 80° C. for 15 minutes
SC1 Treatment
  immersed in a 1:1:10 (volume ratio) mixture of aqueous ammonia/hydrogen peroxide/deionized water at 23° C. for 30 minutes

TABLE 3

| | Phase shift change (°) | Transmittance change (%) |
|---|---|---|
| No irradiation (Before irradiation) | 4.57 | −0.35 |
| Irradiated (After irradiation) | 3.67 | −0.25 |

It is seen from these data that the changes in phase shift and transmittance of the flash light-irradiated halftone phase shift film before and after the chemical treatment are reduced as compared with those of the flash light-unirradiated film. This indicates that the irradiation with flash lamp light also improves the chemical resistance of a halftone phase shift film.

Example 6

A halftone phase shift film of MoSiON was deposited on a substrate as in Example 1 except that the transmittance was set at 20%, and then irradiated with flash lamp light as in Example 1 except that the flash lamp irradiation was made at the energy density reported in Table 4. The film stress before and after the irradiation was determined, with the results shown in Table 4.

Example 7

A halftone phase shift film of MoSiON was deposited on a substrate as in Example 1 except that the exposure light was of a KrF excimer laser (248 nm), and then irradiated with flash lamp light as in Example 1 except that the flash lamp irradiation was made at the energy density reported in Table 4. The film stress before and after the irradiation was determined, with the results shown in Table 4.

Example 8

A halftone phase shift film of MoSiON was deposited on a substrate as in Example 1 except that the exposure light was of a KrF excimer laser (248 nm) and the transmittance was set at 30%, and then irradiated with flash lamp light as in Example 1 except that the flash lamp irradiation was made at the energy density reported in Table 4. The film stress before and after the irradiation was determined, with the results shown in Table 4.

Example 9

A halftone phase shift film of MoSiON was deposited on a substrate as in Example 1 except that the exposure light was of a $F_2$ laser (157 nm), and then irradiated with flash lamp light as in Example 1 except that the flash lamp irradiation was made at the energy density reported in Table 4. The film stress before and after the irradiation was determined, with the results shown in Table 4.

Example 10

A halftone phase shift film of MoSiON was deposited on a substrate as in Example 1 except that the exposure light was of a $F_2$ laser (157 nm) and the set transmittance was 20%, and then irradiated with flash lamp light as in Example 1 except that the flash lamp irradiation was made at the energy density reported in Table 4. The film stress before and after the irradiation was determined, with the results shown in Table 4.

It is seen that the stress in the halftone phase shift film can be controlled as desired by adjusting the energy of flash lamp light irradiation.

Comparative Example 1

A halftone phase shift film of MoSiON was deposited on a substrate as in Example 1, and then annealed at a temperature of 300° C. for 2 hours instead of flash lamp irradiation. The film stress before and after the annealing was determined, with the results shown in Table 4.

The film stress changed only a little from a compressive stress of 1256 MPa to a compressive stress of 1026 MPa, indicating insufficient relaxation of the film stress.

TABLE 4

| | Energy density (J/cm$^2$) | Before irradiation | | After irradiation | |
|---|---|---|---|---|---|
| | | Stress direction | Stress (MPa) | Stress direction | Stress (MPa) |
| Example 6 | 31.0 | compressive | 644 | compressive | 32 |
| Example 7 | 11.5 | compressive | 1376 | compressive | 129 |
| Example 8 | 28.2 | compressive | 759 | compressive | 258 |
| Example 9 | 31.0 | compressive | 352 | compressive | 3 |
| Example 10 | 27.6 | compressive | 646 | compressive | 126 |
| Comparative Example 1 | — | compressive | 1256 | compressive | 1026 |

Examples 11 and 12

In each Example, halftone phase shift films of MoSiON were deposited on five substrates as in Example 1. The substrates were heated at a temperature of 80° C. and placed in an air atmosphere (clean room atmosphere having cleaned air introduced therein) (Example 11) or directly placed in an air atmosphere (clean room atmosphere having cleaned air introduced therein) without heating (Example 12) while the five substrates were sequentially irradiated with flash lamp light at an energy density of 23.9 J/cm$^2$. It is noted that in Example 12 where the substrates were not heated, since the temperature of the irradiating atmosphere rises as the irradiation operation is repeated, the substrate temperature rises with time from room temperature whenever irradiation operation was effected on the five substrates.

The phase shift and transmittance distribution of the halftone phase shift film were measured both before and after the flash lamp irradiation, and their variations among substrates were evaluated, with the results shown in Table 5.

TABLE 5

| | | Heating | Variation among substrates | | Atmosphere |
| --- | --- | --- | --- | --- | --- |
| | | | Before irradiation | After irradiation | |
| Phase shift (°) | Example 11 | heated @ 80° C. | 0.85 | 0.41 | air (clean room) |
| | Example 12 | unheated | 0.83 | 0.91 | air (clean room) |
| Transmittance (%) | Example 11 | heated @ 80° C. | 0.04 | 0.07 | air (clean room) |
| | Example 12 | unheated | 0.05 | 0.10 | air (clean room) |

Examples 13 and 14

In each Example, halftone phase shift films of MoSiON were deposited on four substrates as in Example 1. The substrates were heated at a temperature of 80° C. and placed in a nitrogen atmosphere (Example 13) or heated at a temperature of 80° C. and placed in an air atmosphere (clean room atmosphere having cleaned air introduced therein) (Example 14) while the four substrates were sequentially irradiated with flash lamp light at an energy density of 23.9 J/cm² at intervals of one substrate per day.

The phase shift and transmittance distribution of the halftone phase shift film were measured both before and after the flash lamp irradiation, and their variations among substrates were evaluated, with the results shown in Table 6.

TABLE 6

| | | Heating | Variation among substrates | | Atmosphere |
| --- | --- | --- | --- | --- | --- |
| | | | Before irradiation | After irradiation | |
| Phase shift (°) | Example 13 | heated @ 80° C. | 0.83 | 0.46 | nitrogen |
| | Example 14 | heated @ 80° C. | 0.81 | 0.63 | air (clean room) |
| Transmittance (%) | Example 13 | heated @ 80° C. | 0.03 | 0.03 | nitrogen |
| | Example 14 | heated @ 80° C. | 0.03 | 0.06 | air (clean room) |

It is seen from the results of Examples 11 to 14 that when substrates having a halftone phase shift film deposited thereon are heated and irradiated with flash lamp light, the variation in phase shift among substrates is reduced without substantially altering the variation in transmittance among substrates. The variation in phase shift among substrates can be further reduced particularly when substrates are heated and irradiated with flash lamp light in a nitrogen atmosphere.

Japanese Patent Application No. 2004-147403 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a photomask blank having a light-absorbing film on a transparent substrate, comprising the steps of forming a light-absorbing film on a transparent substrate, and irradiating the light-absorbing film with light from a flash lamp at an energy density of 3 to 40 J/cm².

2. A method for preparing a photomask blank having a light-absorbing film on a transparent substrate, comprising the steps of forming a light-absorbing film on a transparent substrate, and irradiating the light-absorbing film with light from a flash lamp at such an energy density that the stress in the light-absorbing film becomes -300 to 300 MPa in compression stress as a result of light exposure.

3. A method for preparing a photomask blank having a light-absorbing film on a transparent substrate, comprising the steps of forming a light-absorbing film on a transparent substrate, and irradiating the light-absorbing film with light from a flash lamp at an energy density in a range of ±5 J/cm² relative to the central value equal to the energy density at which the stress in the light-absorbing film is 0 MPa as a result of light exposure.

4. A method for preparing a photomask blank according to any one of claims 1 to 3, wherein the light-absorbing film is formed by sputtering.

5. A method for preparing a photomask blank according to claim 4, wherein the light-absorbing film is a halftone phase shift film comprising at least one layer comprising silicon, a metal other than silicon, and at least one element selected from oxygen, nitrogen and carbon.

6. A method for preparing a photomask blank according to claim 5, wherein the metal other than silicon is selected from the group consisting of W, Mo, Ti, Ta, Zr, Hf, Nb, V, Co, Cr and Ni and mixtures thereof.

7. A method for preparing a photomask blank according to claim 5, wherein the halftone phase shift film has a transmittance of 5 to 7% to KrF excimer laser light, and is irradiated with light from the flash lamp at an energy density of 5.5 to 16.5 J/cm².

8. A method for preparing a photomask blank according to claim 5, wherein the halftone phase shift film has a transmittance of 18 to 32% to KrF excimer laser light, and is irradiated with light from the flash lamp at an energy density of 16.8 to 31 J/cm².

9. A method for preparing a photomask blank according to claim 5, wherein the halftone phase shift film has a transmittance of 5 to 7% to ArF excimer laser light, and is irradiated with light from the flash lamp at an energy density of 14.7 to 27.5 J/cm².

10. A method for preparing a photomask blank according to claim 5, wherein the halftone phase shift film has a transmittance of 18 to 32% to ArF excimer laser light, and is irradiated with light from the flash lamp at an energy density of 21 to 36 J/cm².

11. A method for preparing a photomask blank according to claim 5, wherein the halftone phase shift film has a transmittance of 5 to 7% to $F_2$ laser light, and is irradiated with light from the flash lamp at an energy density of 21.8 to 36 J/cm².

12. A method for preparing a photomask blank according to claim 5, wherein the halftone phase shift film has a transmittance of 18 to 32% to $F_2$ laser light, and is irradiated with light from the flash lamp at an energy density of 25.2 to 40 J/cm².

13. A method for preparing a photomask blank according to claim 1, wherein the flash lamp produces flashes of light having a duration of 0.1 to 100 msec.

14. A method for preparing a photomask blank according to claim 1, wherein the irradiating step continues to a cumulative irradiation time of up to 1 second.

15. A method for preparing a photomask blank according to claim 1, wherein in the irradiating step, the substrate is heated at 50 to 300°C.

16. A method for preparing a photomask blank according to claim 1, wherein the irradiating step is carried out in a nitrogen atmosphere.

17. A method for preparing a photomask, comprising the steps of:

forming a resist pattern on a photomask blank prepared by a method comprising forming a light-absorbing film on a transparent substrate, and irradiating the light-absorbing film with light from a flash lamp at an energy density of 3 to 40 $J/cm^2$, by photolithography, etching away those portions of the light-absorbing film which are not covered with the resist pattern, and removing the resist.

* * * * *